United States Patent [19]
Leonardi

[11] Patent Number: 6,121,640
[45] Date of Patent: Sep. 19, 2000

[54] MONOLITHICALLY INTEGRATED DEVICE WITH PROTECTIVE STRUCTURE

[75] Inventor: Salvatore Leonardi, Aci S. Antonio, Italy

[73] Assignee: STMicroelectronics S.r.l., Agrate Brianza, Italy

[21] Appl. No.: 09/336,639

[22] Filed: Jun. 18, 1999

[30] Foreign Application Priority Data

Jun. 19, 1998 [EP] European Pat. Off. ............. 98830373

[51] Int. Cl.$^7$ ........................ H01L 29/74; H01L 31/111
[52] U.S. Cl. ........................ 257/137; 257/168; 257/173; 257/481
[58] Field of Search .................. 257/121, 122, 257/124, 132, 127–129, 133, 137, 144, 152, 154, 168, 170, 173, 361, 362, 481, 575, 577, 578, 579

[56] References Cited

U.S. PATENT DOCUMENTS

| | | | |
|---|---|---|---|
| 4,032,958 | 6/1977 | Yagi et al. | 257/167 |
| 4,051,504 | 9/1977 | Hile | 257/355 |
| 4,489,340 | 12/1984 | Ueda et al. | 257/114 |
| 5,293,051 | 3/1994 | Mariyama et al. | 257/129 |
| 5,923,055 | 7/1999 | Schlangenotto et al. | 257/147 |

FOREIGN PATENT DOCUMENTS

0 569 114  11/1993  European Pat. Off. .

Primary Examiner—Donald L. Monin, Jr.
Assistant Examiner—Hoai Pham
Attorney, Agent, or Firm—Theodore E. Galanthay; Robert Iannucci; Seed IP Law Group PLLC

[57] ABSTRACT

A monolithic integrated device includes a protection structure and is formed in a semiconductor material substrate having a first conductivity type, which device includes at least a first epitaxial layer formed on the substrate. The integrated device further includes a bipolar first transistor formed of a base region having a second conductivity type and including a first buried region formed in the first epitaxial layer, and having a first diffused region which extends from the first buried region to contact a top surface of the integrated device through a surface contact region with a high concentration of dopant material. The first transistor also has an emitter region with the first conductivity type, embedded in the base region, and including a second buried region formed on the first buried region and a second diffused region, with a high concentration of dopant material, which extends from the second buried region to contact the top surface of the integrated device. The integrated device additionally comprises a second transistor of the MOS type having a drain region formed in the emitter region of the first transistor, said drain region incorporating a third diffused region with a high concentration of dopant material and the first conductivity type which includes a source region of the second transistor. The protection structure is formed of the overlap of the surface contact region and at least one of the diffused regions with a high concentration of dopant material to provide a low breakdown voltage junction of the Zener type.

20 Claims, 12 Drawing Sheets

MONOLITHICALLY INTEGRATED DEVICE WITH PROTECTIVE STRUCTURE

TECHNICAL FIELD

This invention relates to a monolithic integrated device, specifically of the emitter switching type with a protection structure.

BACKGROUND OF THE INVENTION

As is known, the expression "emitter switching" is generally used to denote a circuit configuration wherein a first bipolar or MOS transistor, operated at a low voltage, cuts off the flow of current to an emitter terminal of a second bipolar transistor operated at a high voltage, for example, thereby turning it off.

To illustrate the point, reference will be made to FIGS. 1 and 2, which show a monolithic integrated device in an emitter switching configuration of the MOS-bipolar type and its electric diagram, respectively.

Figures 1, 2:
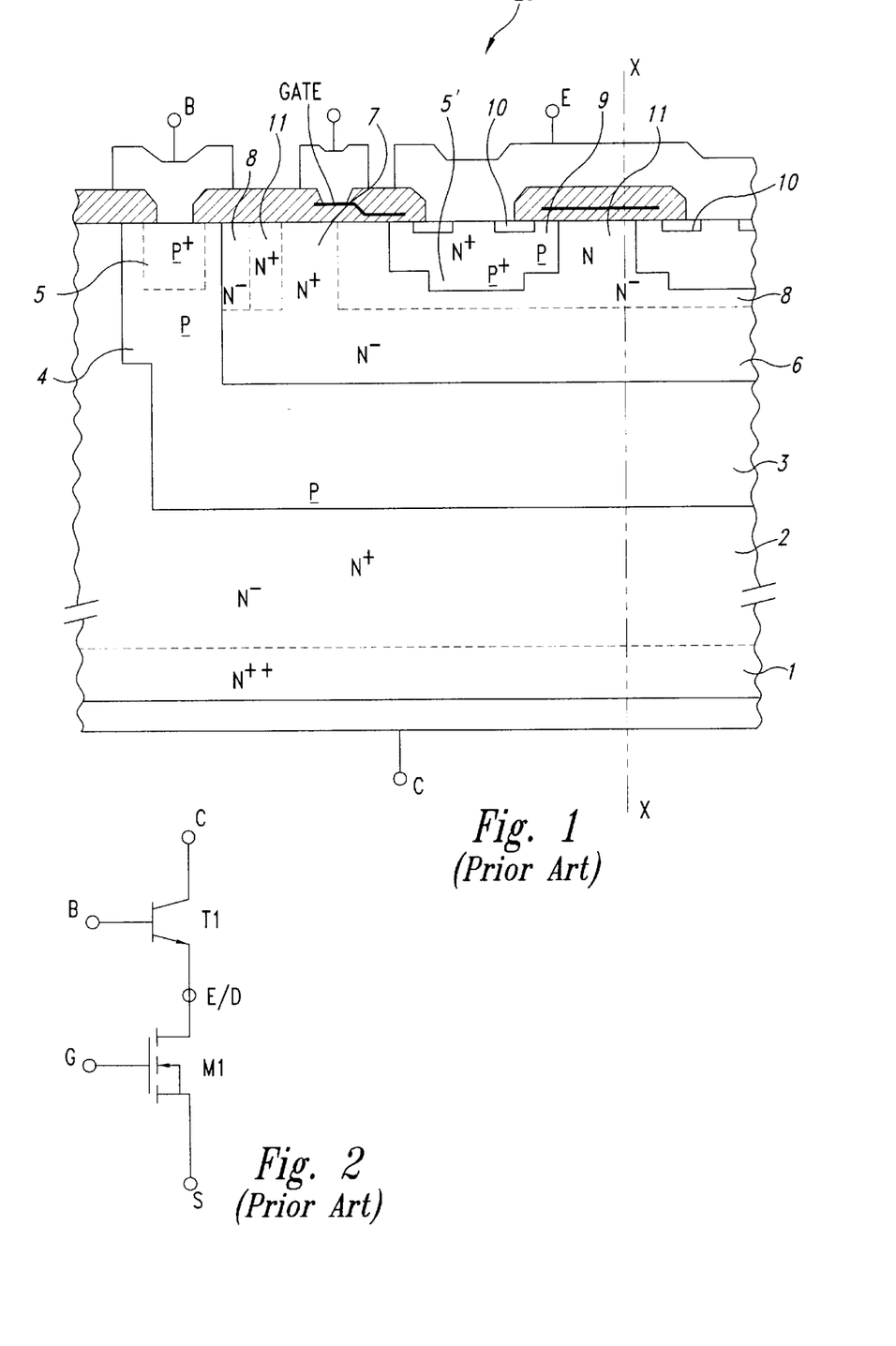
FIG. 1 is a vertical cross-section view showing, to an enlarged scale, an integrated device in an emitter switching configuration of the MOS-bipolar type, according to the prior art.
FIG. 2 shows an equivalent electric diagram of the integrated device in FIG. 1.

More particularly, FIG. 1 is a detail view of a monolithic integrated device of the emitter switching type, carrying the reference numeral 20, which is formed in a semiconductor material substrate 1 having a first conductivity type, specifically N++.

Also with reference to FIG. 1, the device 20 includes a first epitaxial layer 2 formed on the substrate 1 and having the same conductivity type of the substrate, specifically N−.

The device 20 further includes a first transistor T1 of the bipolar type and a second transistor M1 of the MOS type which are connected together through respective emitter E and drain D terminals, as shown in FIG. 2.

As shown in FIG. 2, the first transistor T1 is of the NPN type and the second transistor M1 is of the N-MOS type.

With further reference to FIG. 1, the first transistor T1 has a collector region 1, 2 formed in the first epitaxial layer 2 of the substrate 1, and a base region 3, 4, 5 having a second conductivity type, specifically P, including a first buried region 3 formed in the first epitaxial layer 2, and a first diffused region 4 which extends from the first buried region 3 to contact a top surface of the integrated device 20 through a first surface contact region 5 having a high concentration of a dopant material, specifically of the P+ type.

The region 5 is arranged to minimize the contact resistance to the top surface of the device.

The first transistor T1 further comprises an emitter region 6, 7 with the first conductivity type, specifically N, which is bounded by the base region 3, 4, 5 and includes a second buried region 6 formed over the first buried region 3, and a second diffused region 7 having a high concentration of a dopant material, specifically of the N+ type, and extending from the second buried region 6 to contact the top surface of the integrated device 20.

Referring further to FIG. 1, the second transistor M1 has a drain region 6, 7 included in the emitter region 6, 7 of the first transistor T1.

Said second transistor M1 also has a second epitaxial layer 8 located above the second buried region 6 and having the first conductivity type, specifically the N− type.

The epitaxial layer 8 includes, at the top surface of the device 20, an enhancement region 11 of the N-well type having conductivity of the N+ type.

During the device 20 integration process, when the first surface contact region 5 is formed, a "deep body" region 5' is also formed within the epitaxial layer 8 which includes a "body" region 9 in its upper portion, both regions being parts of the second transistor M1, as shown in FIG. 1.

The regions 5' and 9 have the second, respectively P+ and P, conductivity type.

Connected with the region 9 is also a third diffused region 10 having a high concentration of dopant material and the first conductivity type, specifically N+, and including a source region of the second transistor M1.

Figure 3:
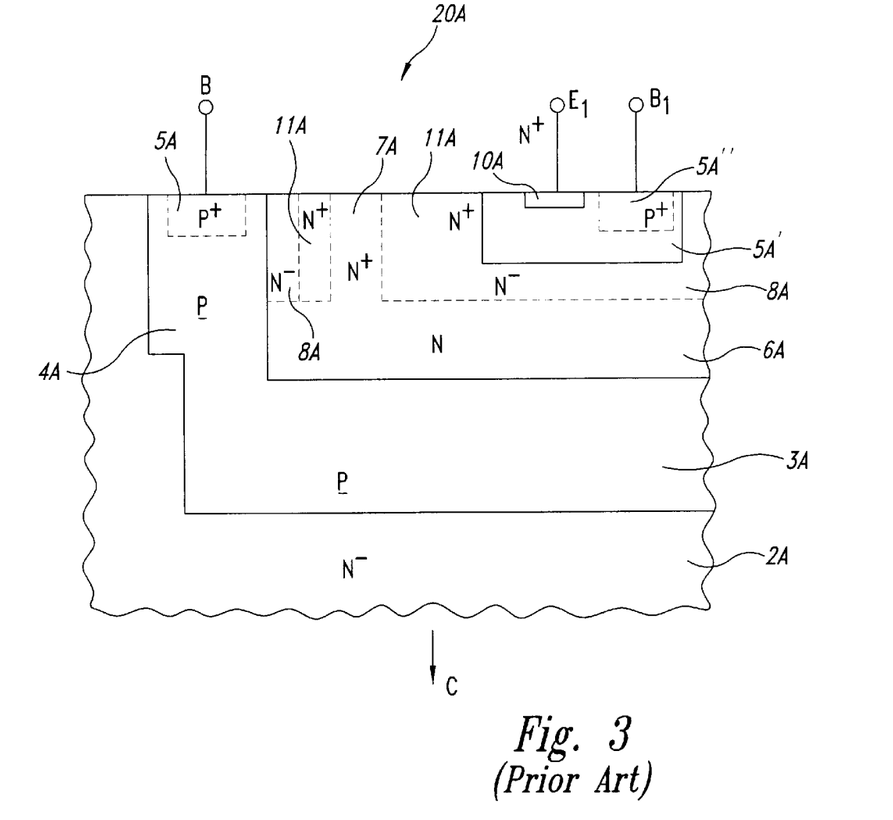
FIG. 3 is a vertical cross-section view showing, to an enlarged scale, an integrated device in an emitter switching configuration of the bipolar-bipolar type, according to the prior art.
Figure 4:
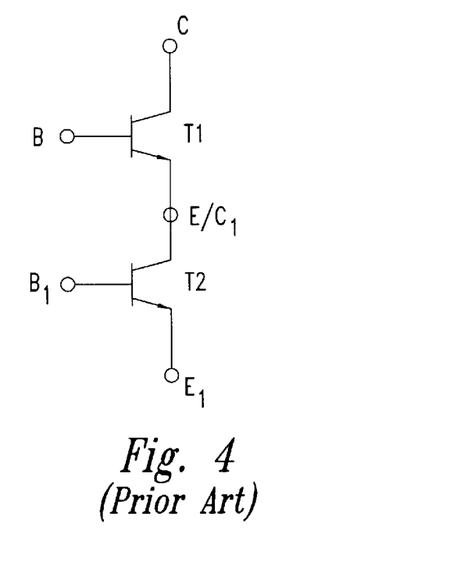
FIG. 4 shows an equivalent electric diagram of the integrated device in FIG. 3.

Referring now to FIGS. 3 and 4, there are shown a monolithic integrated device 20A in the emitter switching configuration of the bipolar-bipolar type and its electric diagram, respectively.

This second known embodiment of an emitter switching device has the second transistor M1 of the MOS type replaced by a second (NPN) transistor T2 of the bipolar type which is connected with a respective collector terminal C to the emitter terminal E of the first transistor T1, as shown in FIG. 4.

With reference to FIG. 3, the second transistor T2 has a collector region 6A, 7A included in the emitter region 6A, 7A of the first transistor T1.

Said second transistor T2 also has a second epitaxial layer 8A, located above the second buried region 6A and having the first conductivity type, specifically N−.

The second epitaxial layer 8A includes, at the top surface of the device 20A, an enhancement region 11A of the N-well type which has conductivity of the N+ type.

The second transistor T2 further comprises a base region 5A', formed in the second epitaxial layer 8A, which contacts the top surface of the integrated device 20A through a second surface contact region 5" at a high concentration of a dopant material, specifically of the P+ type, as shown in FIG. 3.

Further with reference to FIG. 3, formed in the base region 5A', 5A" is a third diffused region 10A at a high dopant concentration, having the first conductivity type, specifically N+, and including an emitter region of the second transistor T2.

Figure 5:
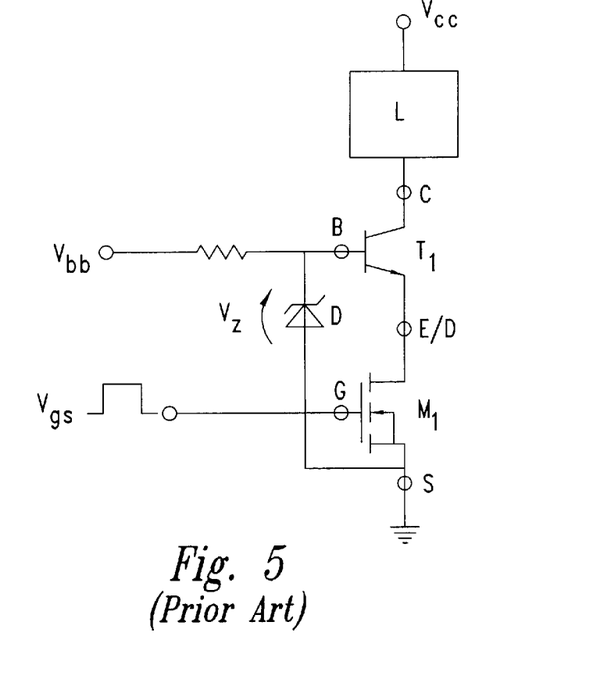
FIG. 5 is a complete electric diagram of a device in an emitter switching configuration of the MOS-bipolar type.

To illustrate the problem pertinent to this invention, reference should be made to FIG. 5, which shows a complete electric diagram of a monolithic integrated device in the emitter switching configuration of the MOS-bipolar type.

As shown in FIG. 5, a device driving voltage Vgs is applied between a gate terminal G and a source terminal S of the second transistor M1.

The current required by the specific application is supplied by a supply voltage Vbb being applied to the base terminal B of the first transistor T1.

Connected to the collector terminal C of the first transistor T1 is a generic load L, and connected to the base terminal B is a power-down diode D of the Zener type.

During the device power-on phase, the first transistor T1 begins to conduct upon a given threshold value Vs being exceeded by the voltage Vg presented at the gate terminal of the second transistor M1, which results in the transistor M1 itself becoming conductive.

During this phase, the diode D is in the 'off' state because its Zener voltage Vz is selected from the designing stage to have a higher value than that of the voltage Vbe present across the base B and emitter E terminals of the first transistor T1.

During the power-down phase, that is as the voltage Vg drops to a value below the threshold voltage Vs, the second transistor M1 is turned off, and the current presented at the emitter terminal E of the first transistor T1 is cancelled.

During this phase, the current presented at the collector terminal C cannot flow through the base region 3A, 4A, 5A.

Therefore this current will flow to a ground terminal through the diode D, whose Zener voltage Vz, although required to be higher than the voltage Vbe, is to be the lowest possible in order to reduce dissipation.

During the device power-down, the emitter/drain voltage Ve/d attains a value equal to the sum of the reverse breakdown voltage of the emitter/base junction, BVebo, of the bipolar component plus the Zener voltage Vz relating to the value of the current presented at the collector terminal C.

If the voltage Ve/d exceeds the value of the breakdown voltage BVdss of the second transistor M1, then the device may be destroyed.

Thus, the operation of the emitter switching device during the power-down step is determined by the following condition being met:

$$BVebo+Vz<BVdss \quad 1]$$

The relation 1] represents a characteristic condition of the device, and accordingly, there is a tendency from the designing stage to minimize the sum of the two terms on the left side of the inequality relative to the value of BVdss.

The voltage Vz is dictated by the diode D, but its value cannot be selected smaller than the voltage Vbe, for the reasons set forth hereinabove.

In principle, the diode D could be replaced with at least two or more diodes in series, placed in forward conduction to the ground terminal and having an equivalent threshold voltage above the voltage Vbe of the transistor T1.

In any case, the value of the Zener voltage Vz cannot be less than a few volts in actual practice.

The value of the voltage BVebo is dependent on the doping of the base 3A, 4A, 5A and emitter 6A, 7A regions that form the base-emitter junction of the first transistor T1.

The breakdown voltage of this junction cannot be a low value, e.g., equal to the Zener diode voltage Vz. That is because, as explained hereinafter, the doping level required for the base region 3A, 4A, 5A and the emitter region 6A, 7A, respectively, would then interfere with proper operation of the emitter switching device.

A first known approach to lowering the value of the breakdown voltage of the base-emitter junction, BVebo, of the first transistor T1 was to minimize the resistivity of the base region 3A, 4A, 5A, while improving the device power-down performance, when the current at the collector terminal C is directed to the ground terminal.

Figure 6:
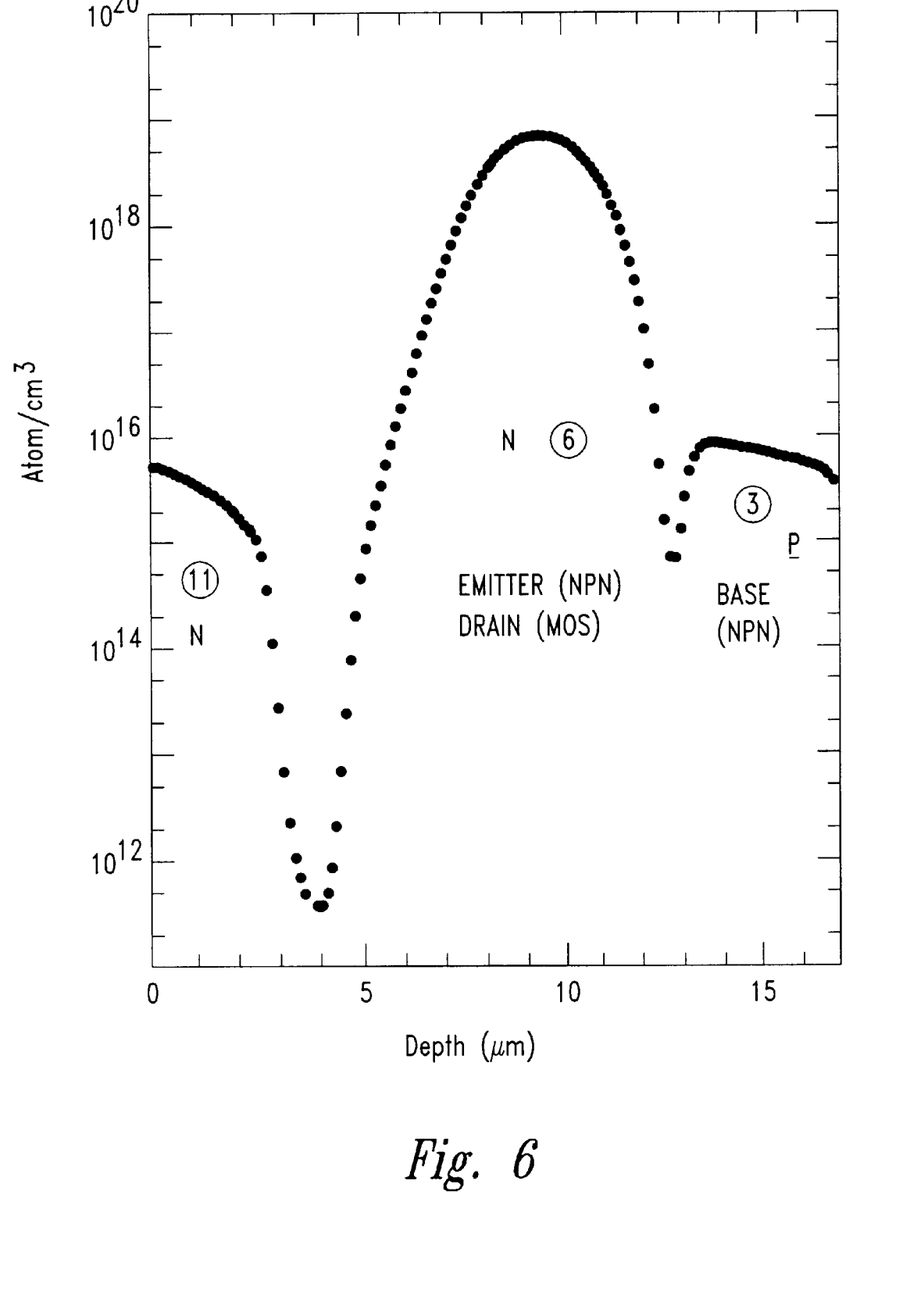
FIGS. 6–9 are plots of electrical quantities present in the device of FIG. 1.

However, the resistivity of the base region 3A, 4A, 5A cannot be decreased at will because, additionally to reducing the gain of the first transistor T1, the P-type dopant (boron) that defines this region—due to its higher diffusion rate than the N-type dopant (antimony) that defines the emitter region 6A, 7A—tends to compensate for, and hence to make highly resistive, the N region underlying the second transistor M1, as illustrated by the graph in FIG. 6.

Figure 7:
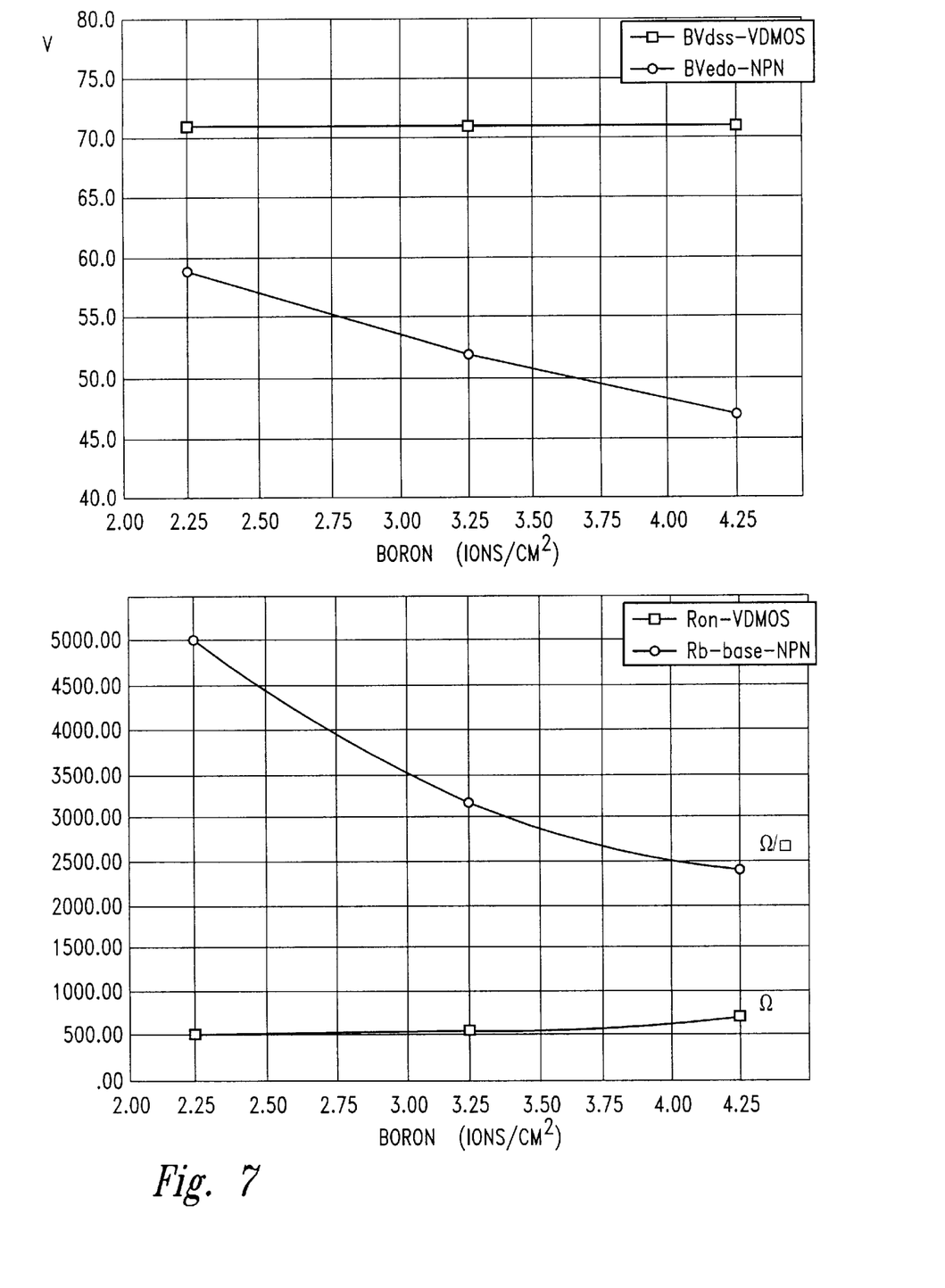

This involves an undesired high Ron of the second transistor M1, which tends to restrict the flow of current through the device, as illustrated by the graphs in FIG. 7.

In order to limit the increase in Ron of the second transistor M1, resulting from a heavily doped base region, there are two actions to be taken.

A first action is to enhance the antimony-doped emitter region 6A, 7A, before forming the second epitaxial layer 8A, by the use of an N-type dopant having a higher diffusion coefficient, such as phosphorus, so as to utilize the back-diffusion of the dopant toward the surface tending to enhance the region underlying the second transistor M1 and, hence, to compensate for the boron from the base region 3A, 4A, 5A.

While being in many ways advantageous, this first action has a disadvantage in that the phosphorus would also diffuse toward the base region 3A, 4A, 5A, causing a substantial increase in resistivity.

Figure 8:
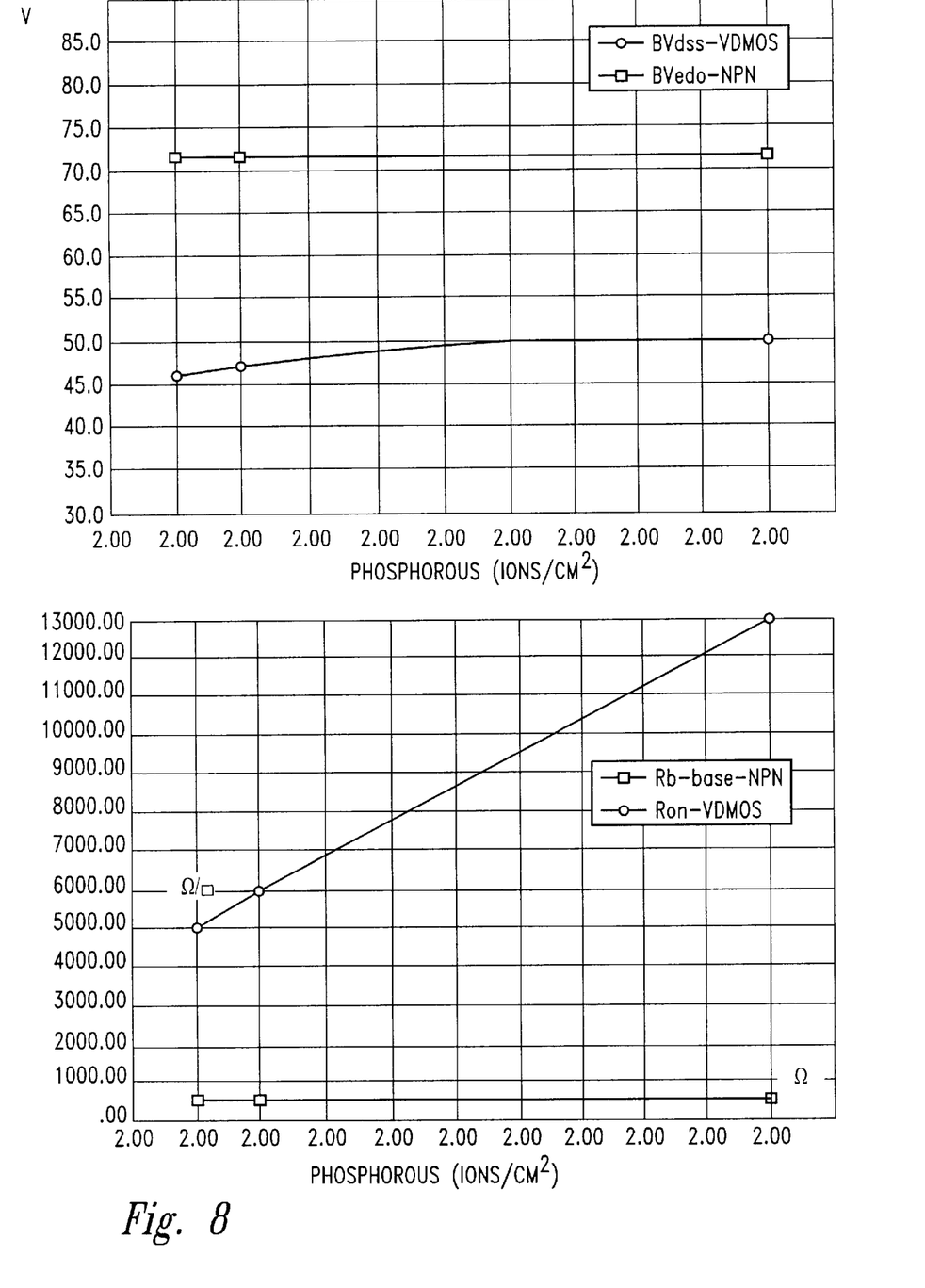

Therefore, this action tends, albeit in an indirect manner, to simultaneously favor the power-down condition 1] and adversely affect the dynamic performance of the device, as illustrated by the graphs in FIG. 8.

The second action is to reduce the thickness of the second epitaxial layer 8A such that the pattern of the phosphorus dopant defining the enhancement region 11A of N-well will overlap the emitter region 6A, 7A, thereby compensating for the boron from the base region 3A, 4A, 5A.

While achieving its objective, not even this second action is devoid of drawbacks.

Figure 9:
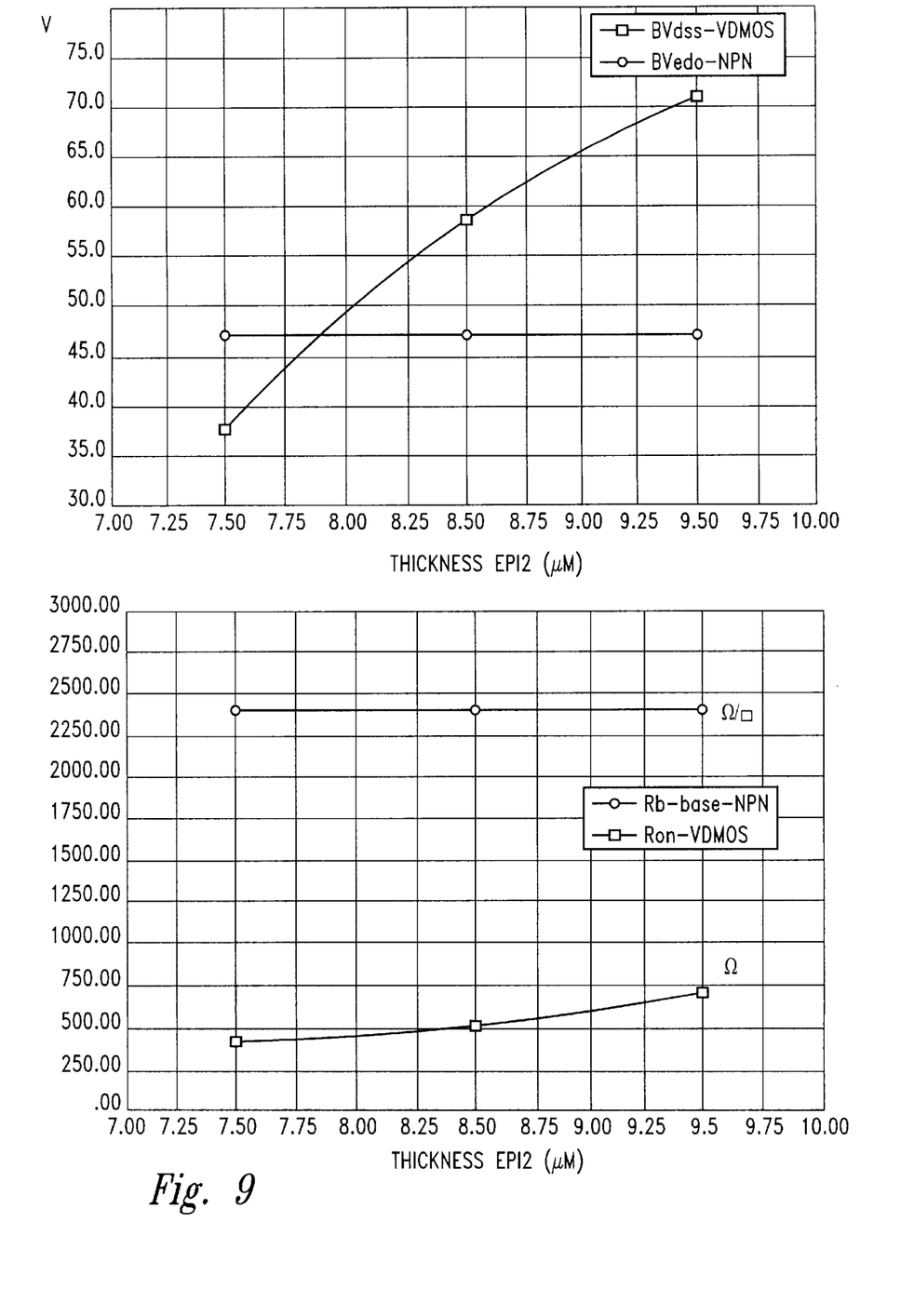

In fact, while requiring no enhancement of additional dopant on the emitter terminal E, as the first action did, and leaving the resistivity unaltered of the base region 3A, 4A, 5A, this action brings about a substantial decrease in the breakdown voltage BVdss of the second transistor M1, contrary to the device power-down condition expressed by relation 1], as illustrated by the graphs in FIG. 9.

A third action would be that of bringing the emitter region 6A, 7A closer to the first diffused region 4A such that the pattern of N-type dopant defining the emitter region 6A, 7A overlaps a base region where the dopant pattern has a higher charge concentration than the base first buried region 3A.

Not even this third action can provide a lower value of BVebo than 30V, although it would indeed bring down the breakdown voltage BVebo between the base terminal B and the emitter terminal E by no less than about 30V, and this without altering the electric parameters of the second transistor M1.

In the instance of an emitter switching device of the bipolar-bipolar type, the condition for power-down and the problems brought forth in discussing conventional approaches to an emitter switching device of the MOS-bipolar type apply again, once BVdss and Ron of the MOS component are substituted with BVces and the collector resistance, respectively, of the low-voltage bipolar component.

SUMMARY OF THE INVENTION

An embodiment of this invention provides a monolithic integrated device of the emitter switching type with a protection structure, which has such construction and functional features as to overcome the limitations and/or drawbacks with which the aforementioned prior art is based.

The device has the value of the breakdown voltage of the base-emitter junction minimized by the provision of a protection structure comprising the overlap of two regions which are doped with dopants of opposite types at concentrations effective to produce a Zener type of junction.

The features and advantages of a device according to the invention will be apparent from the following description of an embodiment thereof, given by way of non-limitative example with reference to the accompanying drawings.

DETAILED DESCRIPTION

Referring to the drawing figures, generally and schematically shown at 20B–J are monolithic integrated devices of the emitter switching type formed in a semiconductor material substrate having a first conductivity type, specifically N–.

Figure 10:
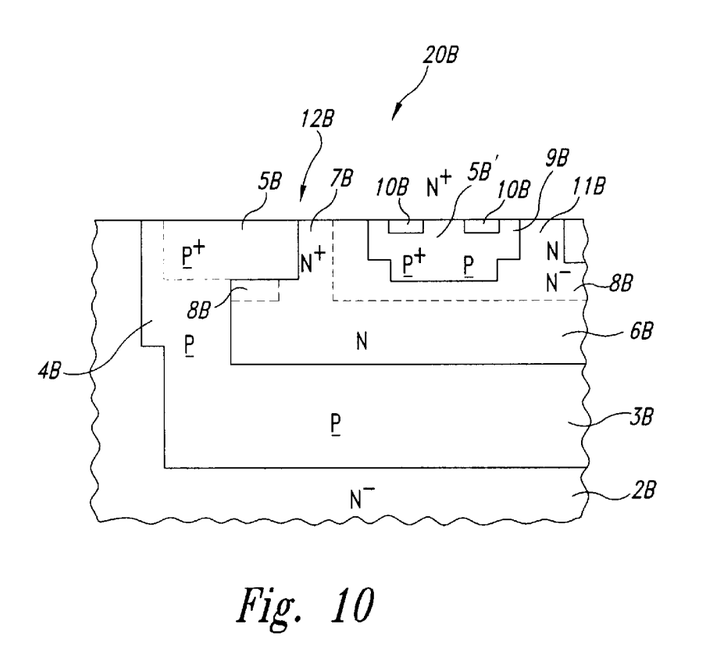
FIG. 10 is a vertical cross-section view showing, to an enlarged scale, an integrated device in an emitter switching configuration of the MOS-bipolar type with a protection structure, according to an embodiment of the invention.
Figure 10A:
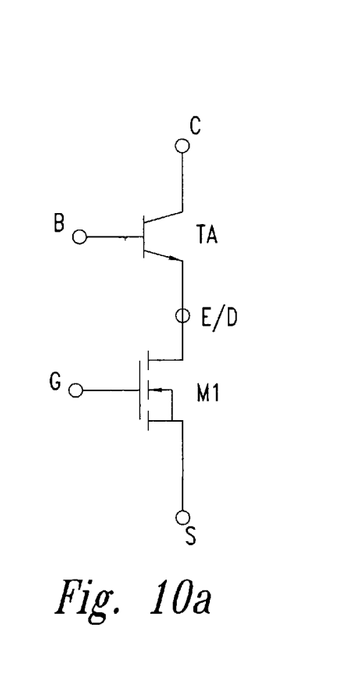
FIG. 10a shows an equivalent electric diagram of the integrated device in FIG. 10.

The device 20B includes a first transistor T1 of the bipolar type and a second transistor M1 of the MOS type, which are connected together through respective emitter E and drain D terminals, as shown in FIG. 10a.

In FIG. 10a, the first transistor T1 is shown to be of the NPN type, and the second transistor M1 of the N-MOS type.

Referring now to FIG. 10, the first transistor T1 has a collector region 2B formed in the first epitaxial layer of the substrate, and a base region 3B, 4B, 5B having a second conductivity type, specifically P, which includes a first buried region 3B formed in the first epitaxial layer 2B, and a first diffused region 4B extending from the first buried region 3B to contact a top surface of the integrated device 20B through a first surface contact region 5B with a high concentration of a dopant material, specifically of the P+ type.

The region 5B is to minimize the contact resistance to the top surface of the device.

The first transistor T1 also has an emitter region 6B, 7B with the first conductivity type, specifically N, which is bounded by the base region 3B, 4B, 5B and includes a second buried region 6B, formed on the first buried region 3B, and a second diffused region 7B at a high dopant concentration, specifically of the N+ type, extending from the second buried region 6B to contact the top surface of the integrated device 20B.

Also with reference to FIG. 10, the second transistor M1 has a drain region 6B, 7B included within the emitter region 6B, 7B of the first transistor T1.

Said second transistor M1 further includes a second epitaxial layer 8B, placed above the second buried region 6B and having the first conductivity type, specifically N–.

The second epitaxial layer 8B includes, located at the top surface of the device 20B, an enhancement region 11B of the N-well type, having conductivity of the N+ type.

During the device 20B integration process, when the surface contact region 5B is formed, a first "deep body" region 5B' is also formed within the epitaxial layer 8B which includes, in its upper portion, a second "body" region 9B, both regions being included in the second transistor M1, as shown in FIG. 10.

The regions 5B' and 9B have conductivities of the second type, respectively the P+ and P types.

Formed at the location of either the region 9B or the second diffused region 7B, is a third diffused region 10B with a high concentration of dopant material, which has the first conductivity type, specifically N+, and includes a source region of the second transistor M1.

As shown in FIGS. 10–13, the devices 20B–E each further comprises a protection structure 12B–E formed by the overlap of the first surface contact region 5B–E and at least one of the diffused regions (7B–E, 10B–E) to provide a low breakdown voltage junction of the Zener type.

In particular, FIG. 10 shows a first embodiment of the structure 12B, wherein the first surface contact region 5B extends laterally to overlap the second diffused region 7B.

Figure 11:
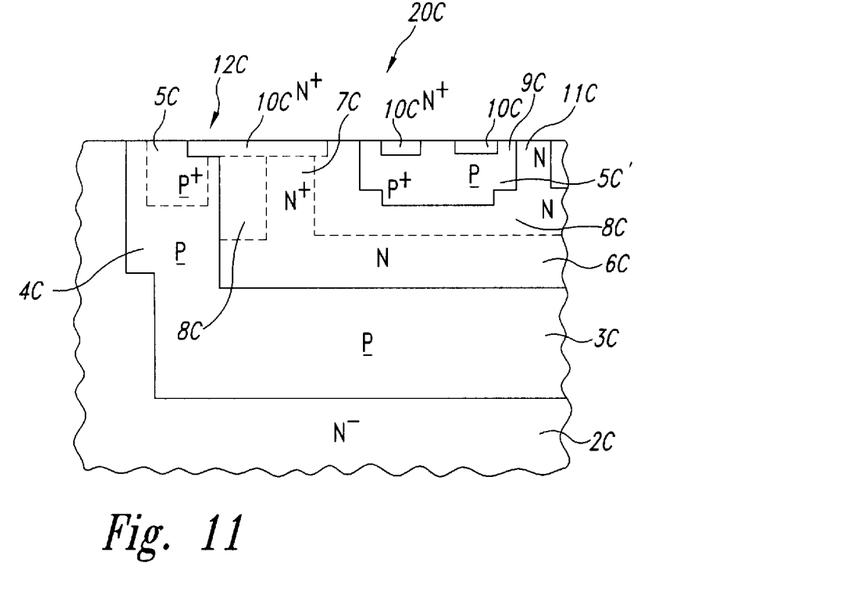
FIG. 11 is a vertical cross-section view showing, to an enlarged scale, a second embodiment of the protection structure in FIG. 10, according to the invention.
Figure 12:
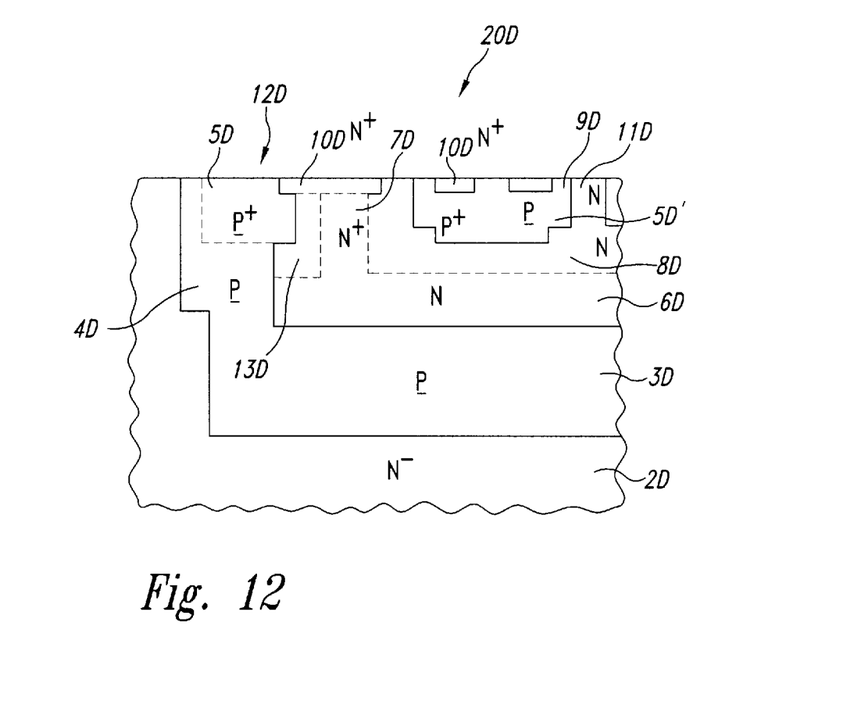
FIG. 12 is a vertical cross-section view showing, to an enlarged scale, a third embodiment of the protection structure in FIG. 10, according to the invention.
Figure 13:
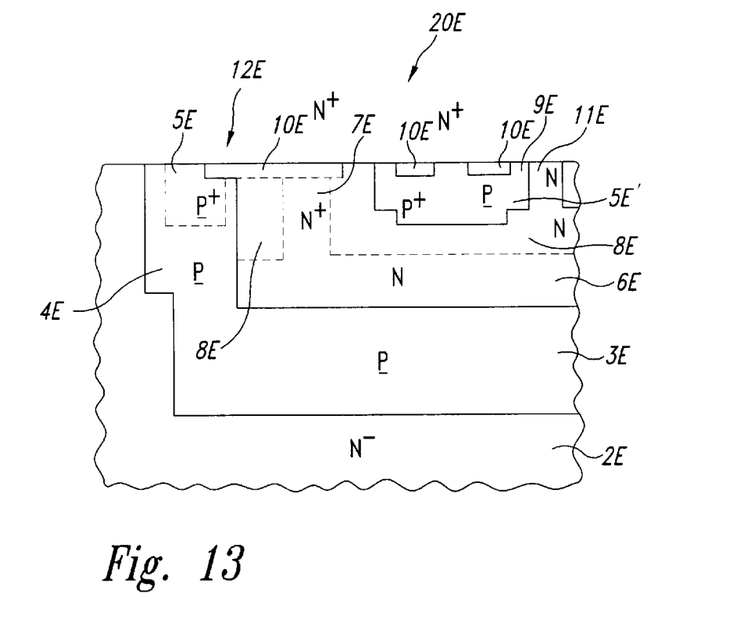
FIG. 13 is a vertical cross-section view showing, to an enlarged scale, a fourth embodiment of the protection structure in FIG. 10, according to the invention.

FIGS. 11, 12 and 13 show three further embodiments of the structure 12C–E.

In particular, the third diffused region 10C is shown in FIG. 11 extended laterally to overlap the second diffused region 7C and the first surface contact region 5C, and FIG. 12 shows the first surface contact region 5D and third diffused region 10D both extended laterally to overlap each other at a portion 13D of the second epitaxial layer 8D.

FIG. 13 illustrates the instance of the third diffused region 10E being formed in the second diffused region 7E and extending laterally therefrom to overlap the first surface contact region 5E.

Referring back to FIG. 1, the base region 3, 4, 5, as well as the emitter-drain region 6, 7, extends to the surface of the device.

Breakdown occurs in the base-emitter junction at the device bulk region, along the contact region between the first buried region 3 and the second buried region 6.

In all four of the embodiments just described of the protection structure 12B–E a PN junction is obtained whose layers are heavily doped to provide a Zener type of junction having a low breakdown voltage value.

An extension of the base-emitter junction is thus obtained which has a breakdown voltage value well below the breakdown voltage on the bulk side.

The surface concentration for the P type regions 4B–E and 5B–E is above E18 ions/cm$^3$, and that for the N type regions 7B and 10E is on the order of E20 ions/cm$^3$.

This enables junctions to be produced having a breakdown voltage value of a few volts, that is, well below the bulk breakdown voltage provided in the prior art.

The emitter-base PN junction formed using the most heavily doped layers present in the device effectively minimizes the value of the voltage BVebo of the first transistor T1.

The left side of relation 1], setting the power-down condition, will take, therefore, the smallest possible value allowed for by the emitter switching structure.

In actual practice, the sum of the terms BVebo+Vz may be no higher than 7V.

Figure 14:
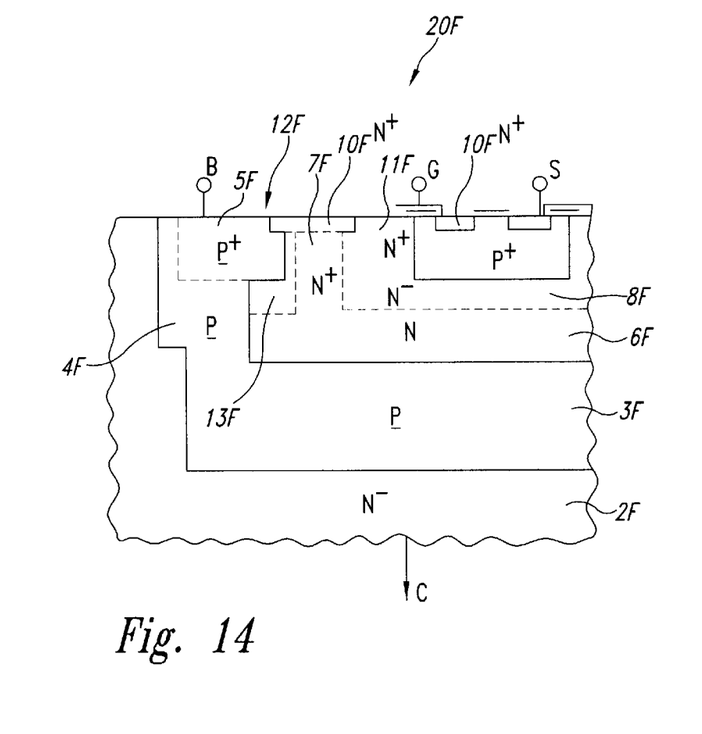
FIG. 14 is a vertical cross-section view showing, to an enlarged scale, a further embodiment of the integrated device in FIG. 10, according to the invention.

In the instance of an emitter switching device of the MOS-bipolar type, the protection structure 12F can be provided even if the MOS component is of the single-body type, since the surface contact region 5F would then represent the body region (FIG. 14) that is also functioning as an enhancement region.

Reference should now be had to FIGS. 15–18, which show a monolithic integrated device 20G–J in the emitter switching configuration of the bipolar-bipolar type and its electric diagram.

Figure 15:
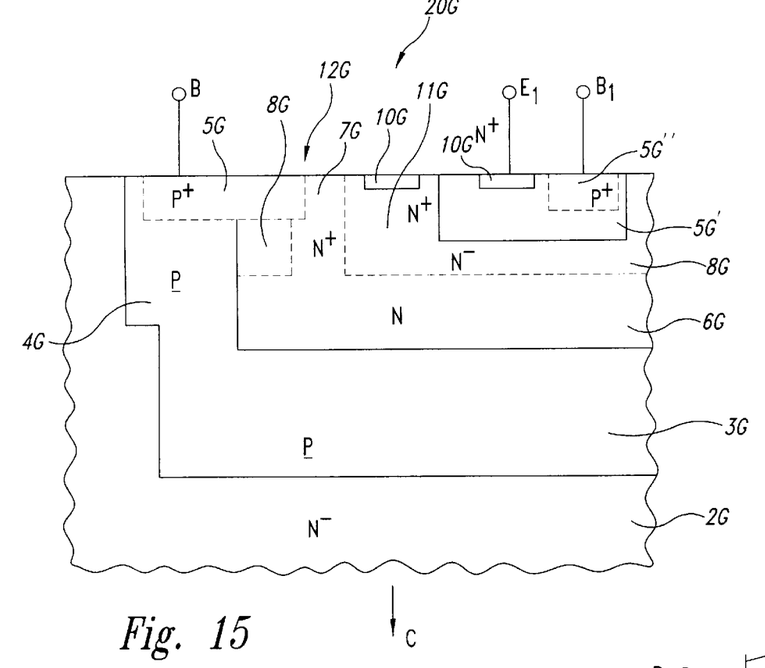
FIG. 15 is a vertical cross-section view showing, to an enlarged scale, an integrated device in an emitter switching configuration of the bipolar-bipolar type with a protection structure, according to an embodiment of the invention.
Figure 15A:
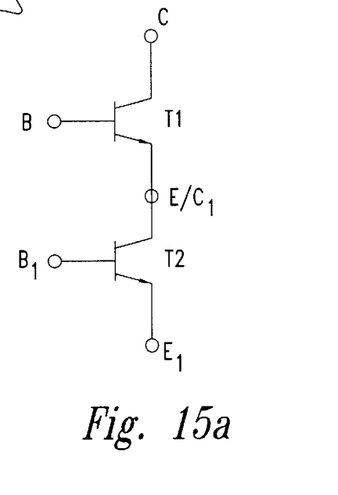
FIG. 15a shows an equivalent electric diagram of the integrated device in FIG. 15.

In this second embodiment of an emitter switching device, the second transistor M1 of the MOS type is replaced by a second (NPN) transistor T2 of the bipolar type which is connected, through a respective collector terminal C, to the emitter terminal E of the first transistor T1, as shown in FIG. 15a.

Referring to FIG. 15, the second transistor T2 has a collector region 6G, 7G included within the emitter region 6G, 7G of the first transistor T1.

Said second transistor T2 also has a second epitaxial layer 8G located above the second buried region 6G and having the first conductivity type, specifically N-.

The epitaxial layer 8G has an enhancement region 11G of the N-well type with conductivity of the N+ type at the top surface of the device 20G.

The second transistor T2 also has a base region 5G' formed in the second epitaxial layer 8G, which region contacts the top surface of the device 20G through a second surface contact region 5G" having a high concentration of a dopant material, specifically of the P+ type, as shown in FIG. 15.

Also with reference to FIG. 15, formed either in the base region (5G', 5G") or the diffused region 7G is a third diffused region 10G at a high concentration of dopant material which has the first conductivity type, specifically N+, and includes an emitter region of the second transistor T2.

The device 20G further comprises a protection structure 12G formed of the overlap of the first surface contact region 5G and at least one of the diffused regions (7G, 10G), to produce a low breakdown voltage junction of the Zener type.

In particular, shown in FIG. 15 is a first embodiment of the structure 12G, wherein the first surface contact region 5G extends laterally to overlap the second diffused region 7G.

Figure 16:
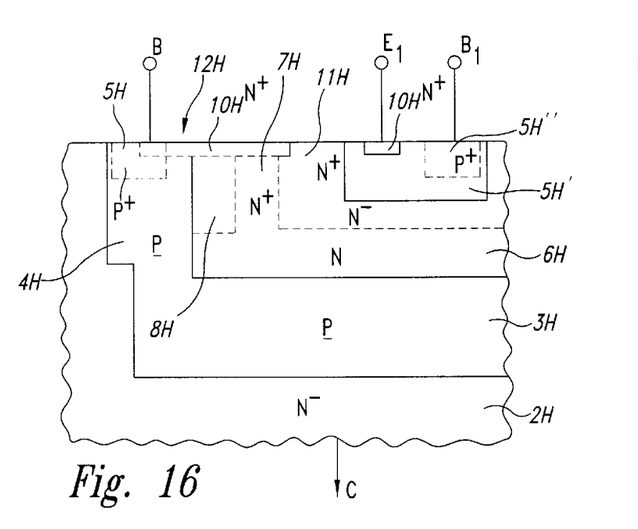
FIG. 16 is a vertical cross-section view showing, to an enlarged scale, a second embodiment of the protection structure in FIG. 15, according to the invention.
Figure 17:
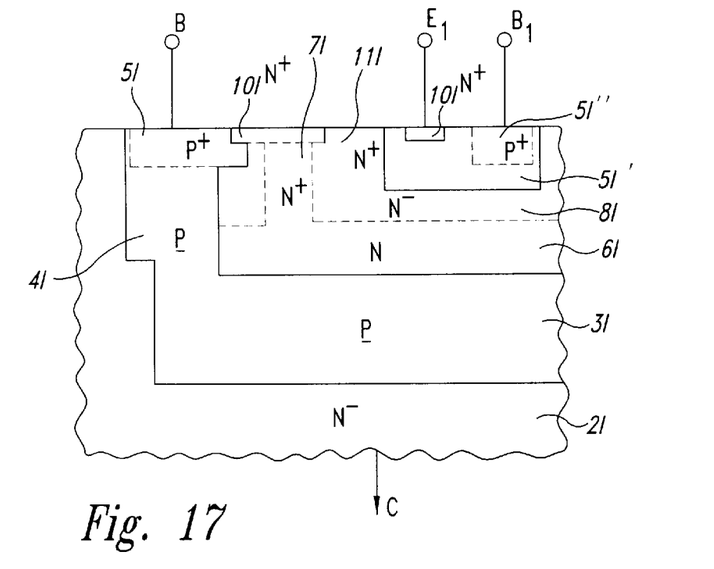
FIG. 17 is a vertical cross-section view showing, to an enlarged scale, a third embodiment of the protection structure in FIG. 15, according to the invention.
Figure 18:
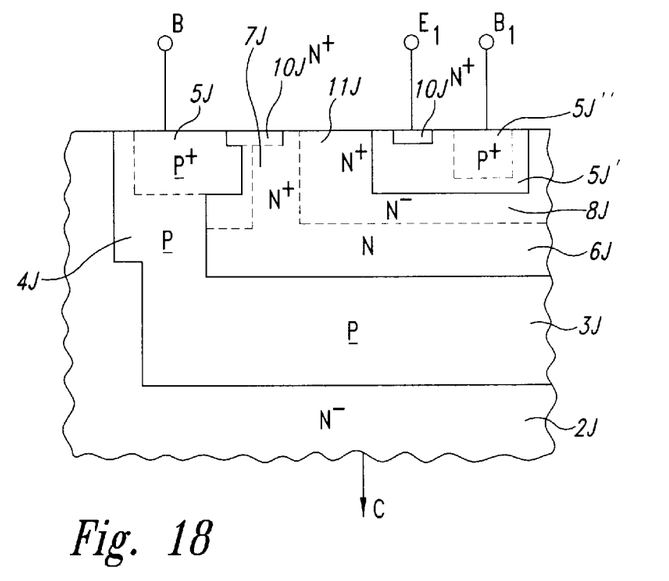
FIG. 18 is a vertical cross-section view showing, to an enlarged scale, a fourth embodiment of the protection structure in FIG. 15, according to the invention.

FIGS. 16, 17 and 18 show three further embodiments of the structure 12H–J.

In particular, the third diffused region 10H is shown in FIG. 16 to extend laterally to overlap the second diffused region 7H and the first surface contact region 5H, and FIG. 17 shows the first surface contact region 5I and third diffused region 10I extended laterally to overlap each other at a portion 13I of the second epitaxial layer 8I.

FIG. 18 shows an instance of the third diffused region 10J being formed in the second diffused region 7J and extending laterally therefrom to overlap the first surface contact region 5J.

In practice, the devices 20B–J can be implemented regardless of the type of the component used for the low-voltage stage.

This because the P-type enhancement region (or "deep body" or "body" layer) and/or the source or the emitter region can always be used where the low-voltage component is of the MOS or the bipolar type, respectively.

Referring then to FIG. 5, if the power-down diode D is integrated, the same layers as have been used to form the emitter-base junction according to the invention can be utilized to form the diode D.

In this case, the power-down condition as set by relation 1] becomes 2 Vz <BVdss or 2Bvebo<BVdss.

To summarize, listed herein below are advantages which accrue from an emitter switching device with protection structure according to the embodiments of the invention shown and discussed herein:

1. The cost of integrating the protection structure is zero because the layers for defining it are already present as basic layers of the emitter switching device to define the regions included within the low-voltage MOS/bipolar component and the high-voltage bipolar component.

2. The value of the breakdown voltage BVebo for the high-voltage bipolar component is the lowest to be obtained from the necessary layers to define the emitter switching device, and therefore favorable to the power-down condition of relation 1].

3. The value of the voltage BVebo is unrelated to the bulk layers of the emitter switching device.

Figure 19:
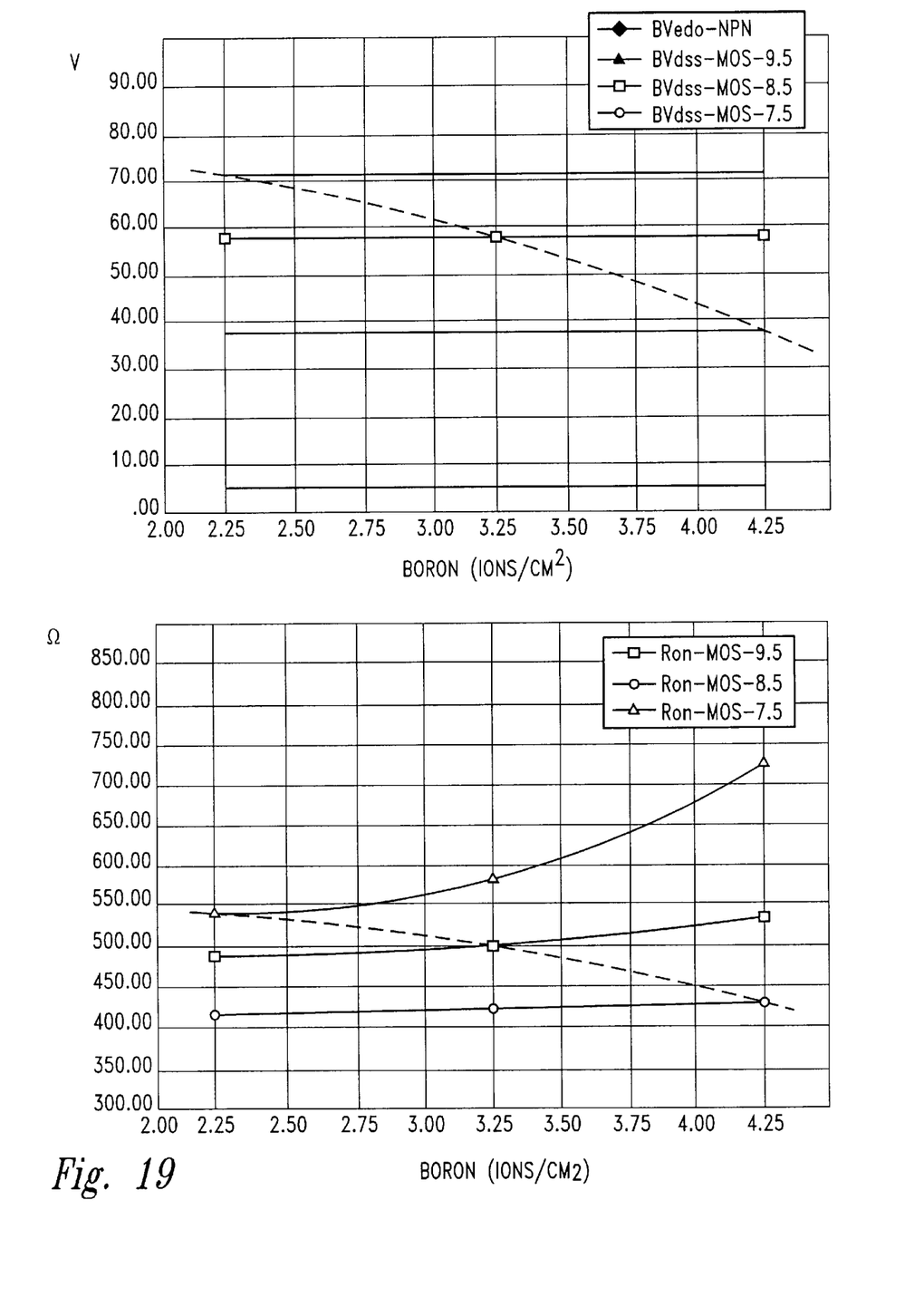
FIG. 19 shows plots of electrical quantities present in the device of FIG. 10.

4. A result of fundamental importance derives from items 2. and 3. above: the protection structure allows the base region 3B–J, 4B–J, 5B–J of the high-voltage bipolar component to be highly enhanced and the thickness of the second epitaxial layer 8B–J to be greatly reduced, thereby improving the dynamic performance of the device during the power-down phase. The substantial reduction in the value of the voltage BVebo (more than 6 times smaller than the smallest value provided in the prior art) allows to be tolerant of low values of the breakdown voltage BVdss of the MOS component (resulting from the decreased epitaxial thickness), without being at odds with the power-down condition of relation 1], as illustrated by the graphs in FIG. 19.

5. At least one of the layers, or both, which define the junction is heavily doped or thin; this ensures a constant value of the voltage BVebo with but a few percent tolerance.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A monolithic integrated device formed on a semiconductor material substrate having a first conductivity type, which device comprises:

an epitaxial layer formed on the substrate and having the first conductivity type;

a first transistor of the bipolar type having a base region with a second conductivity type and including a first buried region formed in the epitaxial layer, and having a first diffused region extending from the first buried region to contact a top surface of the device through a surface contact region with a high concentration of dopant material, said first transistor also having an emitter region with the first conductivity type, embedded in the base region, and including a second buried region formed on the first buried region and a second diffused region, with a high concentration of dopant material, which extends from the second buried region to contact the top surface of the device;

a second transistor of the MOS type having a drain region included within the emitter region of the first transistor, said drain region incorporating a third diffused region with a high concentration of dopant material and the first conductivity type which includes a source region of the second transistor; and a protection structure formed by the surface contact region overlapping at least one of the diffused regions with a high concentration of dopant material to provide a low breakdown voltage junction of the Zener type.

2. A device according to claim 1 wherein the surface contact region extends laterally to overlap the second diffused region.

3. A device according to claim 1 wherein the third diffused region extends laterally to overlap the surface contact region.

4. A device according to claim 1 wherein both the surface contact region and third diffused region extend laterally to overlap each other at a portion of the device.

5. A device according to claim 1 wherein the third diffused region is formed within the second diffused region and extends laterally to overlap the surface contact region.

6. A monolithic integrated device formed on a semiconductor material substrate having a first conductivity type, which device comprises:

an epitaxial layer formed on the substrate and having the first conductivity type;

a first transistor of the bipolar type having a base region with a second conductivity type and including a first buried region formed in the epitaxial layer, and having a first diffused region extending from the first buried region to contact a top surface of the device through a surface contact region with a high concentration of dopant material, said first transistor also having an emitter region with the first conductivity type, embedded in the base region, and including a second buried region formed on the first buried region and a second diffused region, with a high concentration of dopant material, which extends from the second buried region to contact the top surface of the device;

a second transistor of the bipolar type having a collector region included within the emitter region of the first bipolar transistor, said collector region incorporating a third diffused region with a high concentration of dopant material and the first conductivity type which includes an emitter region of the second transistor; and a protection structure formed of the surface contact region overlapping at least one of the diffused regions with a high concentration of dopant material to provide a low breakdown voltage junction of the Zener type.

7. A device according to claim 6, characterized in that the surface contact region extends laterally to overlap the second diffused region.

8. A device according to claim 6, characterized in that the third diffused region extends laterally to overlap the surface contact region.

9. A device according to claim 6, characterized in that both the surface contact region and third diffused region extend laterally to overlap each other at a portion of the integrated device.

10. A device according to claim 6, characterized in that the third diffused region is formed within the second diffused region and extends laterally to overlap the surface contact region.

11. A monolithic integrated device formed on a semiconductor material substrate having a first conductivity type, the device comprising:

a first region of first conductivity type formed on the semiconductor substrate, the first region being a collector of a bipolar first transistor;

a second region of second conductivity type opposite to the first conductivity type, the second region being formed on the first region, having a heavily-doped surface portion formed at a top surface of the device, and being a base of the first transistor;

a third region of first conductivity type formed on the second region, having a heavily-doped surface region formed at the top surface of the device, and being an emitter of the first transistor and a first conductive region of a second transistor, wherein the surface portion of the second region and the surface portion of the third region laterally overlap to form a low breakdown voltage Zener junction.

12. The device of claim 11 wherein the surface portion of the second region extends laterally to overlap the first surface portion of the third region.

13. The device of claim 11 wherein the surface portion of the third region extends laterally to overlap the surface portion of the second region.

14. The device of claim 11 wherein both the surface portion of the second region and surface portion of the third region extend laterally to overlap each other.

15. The device of claim 11, further comprising:

a fourth region of second conductivity type positioned on the third region and being a control region of the second transistor; and a fifth region of first conductivity type positioned at the surface of the device and within the fourth region, the fifth region being a second conductive region of the second transistor.

16. The device of claim 11 wherein the second transistor is a bipolar transistor.

17. The device of claim 11 wherein the second transistor is a bipolar transistor.

18. The device of claim 11 wherein the second region includes a first buried region and a diffused region, the first buried region overlaying the first region and the diffused region extending from the first buried region to the surface portion of the second region; the third region includes a second buried region overlaying the first buried region; and the first surface portion of the third region extending from the second buried region to the surface of the device.

19. The device of claim 11, further comprising:

an epitaxial enhancement region formed on a buried portion of the third region, wherein the surface portion of the third region extends laterally in a first direction over a portion of the enhancement region and laterally in an opposite, second direction over the surface portion of the second region.

20. The device of claim 11 wherein the second region includes a first buried region and a first diffused region, the first buried region overlaying the first region and the first diffussed region extending from the first buried region to the surface portion of the second region; the third region includes a second buried region overlaying the first buried region and a second diffused region that extends from the second buried region to the surface portion of the third region, the device further comprising:

an epitaxial layer formed between the first and second diffused region, wherein the surface portion of the third region extends across the epitaxial layer to the surface portion of the second region.

* * * * *